(12) United States Patent
Hongo et al.

(10) Patent No.: US 8,588,265 B2
(45) Date of Patent: Nov. 19, 2013

(54) SEMICONDUCTOR LASER ELEMENT AND MANUFACTURING METHOD OF THE SAME

(75) Inventors: Kazuhiro Hongo, Kanagawa (JP); Koji Fukumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/552,101

(22) Filed: Jul. 18, 2012

(65) Prior Publication Data

US 2013/0028280 A1 Jan. 31, 2013

(30) Foreign Application Priority Data

Jul. 27, 2011 (JP) ................. 2011-164168

(51) Int. Cl.
*H01S 3/04* (2006.01)

(52) U.S. Cl.
USPC ..................... 372/34; 372/44.01; 372/43.01

(58) Field of Classification Search
USPC ...................... 372/34, 44.01, 43.01
See application file for complete search history.

(56) References Cited

U.S. PATENT DOCUMENTS 6,711,192 B1 * 3/2004 Chikuma et al. ........... 372/43.01

FOREIGN PATENT DOCUMENTS

| JP | 10-075008 | 3/1998 |
| JP | 2002-084036 | 3/2002 |

* cited by examiner

*Primary Examiner* — Kinam Park
(74) *Attorney, Agent, or Firm* — Dentons US LLP

(57) ABSTRACT

Disclosed herein is a semiconductor laser element including: on a substrate, a laser structure section configured to include a semiconductor laminated structure having an n-type semiconductor layer, active layer and p-type semiconductor layer in this order, and a p-side electrode on top of the p-type semiconductor layer; a pair of resonator edges provided on two opposed lateral sides of the semiconductor laminated structure; and films made of a non-metallic material having a thermal conductivity higher than that of surrounding gas, and provided in the region of the top side of the laser structure section including the positions of the resonator edges.

11 Claims, 16 Drawing Sheets

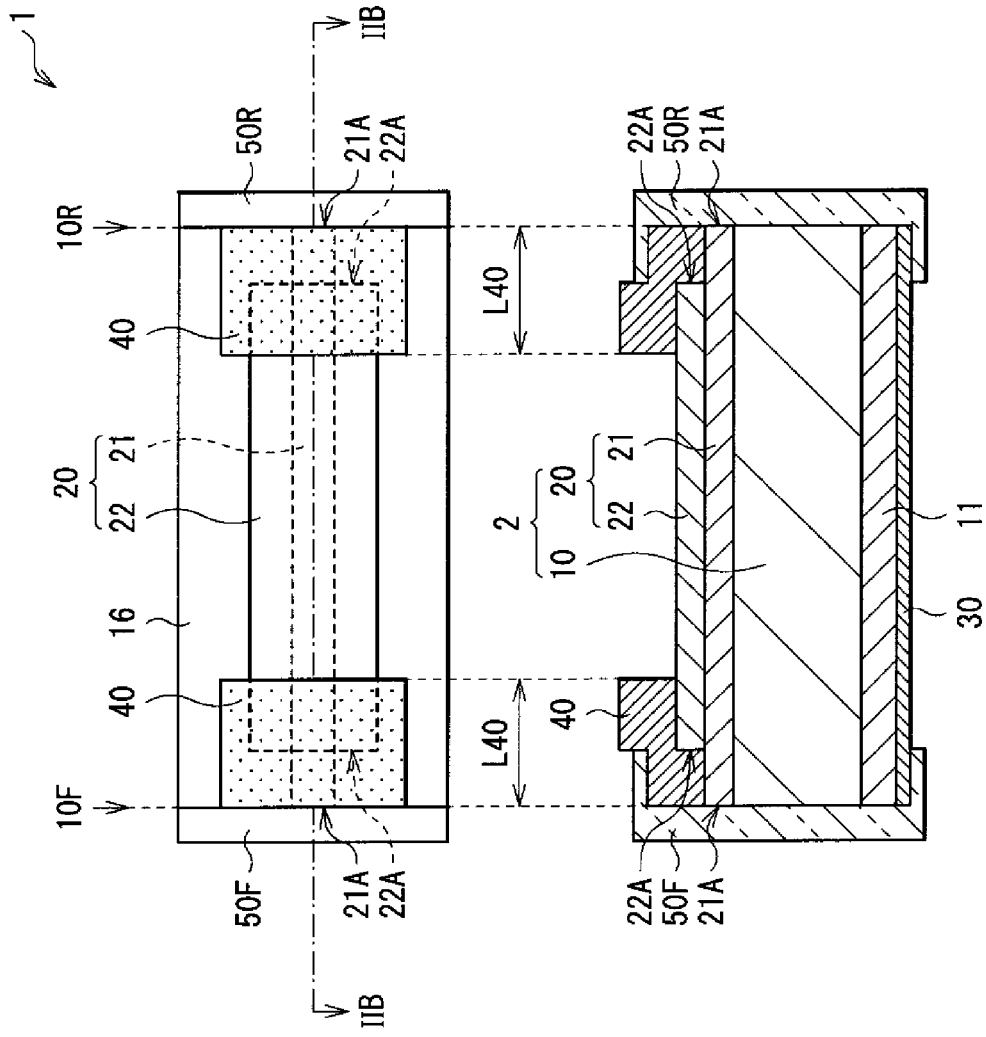

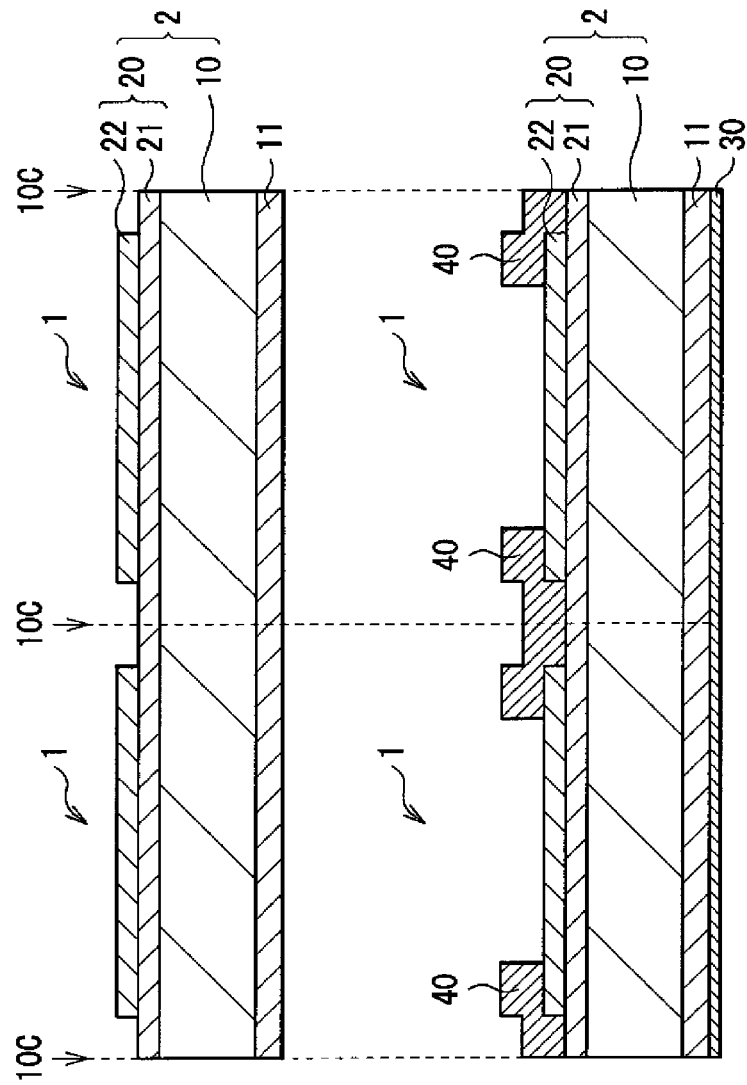

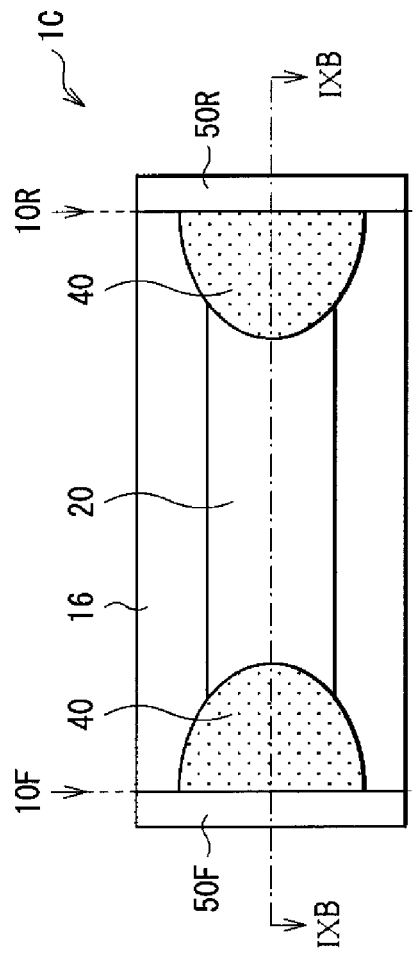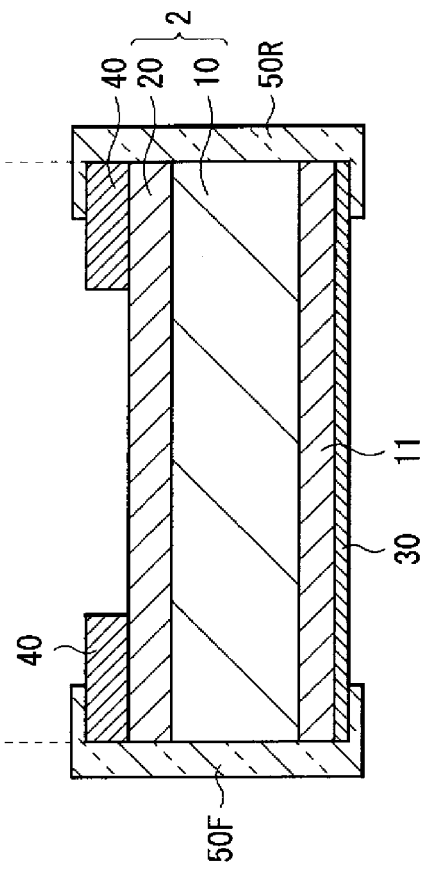
FIG. 9A
FIG. 9B

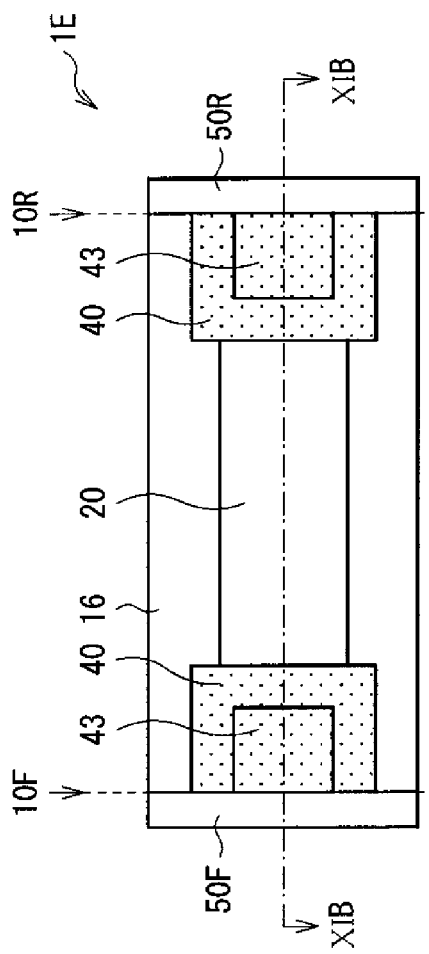
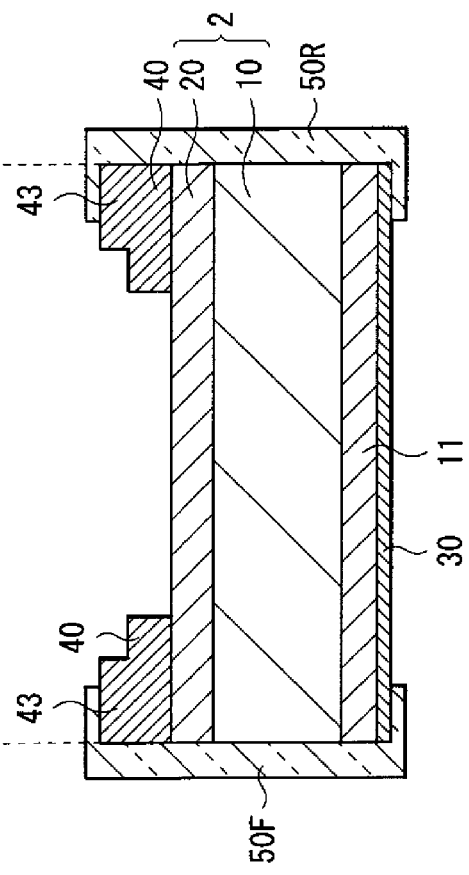
FIG.11A
FIG.11B

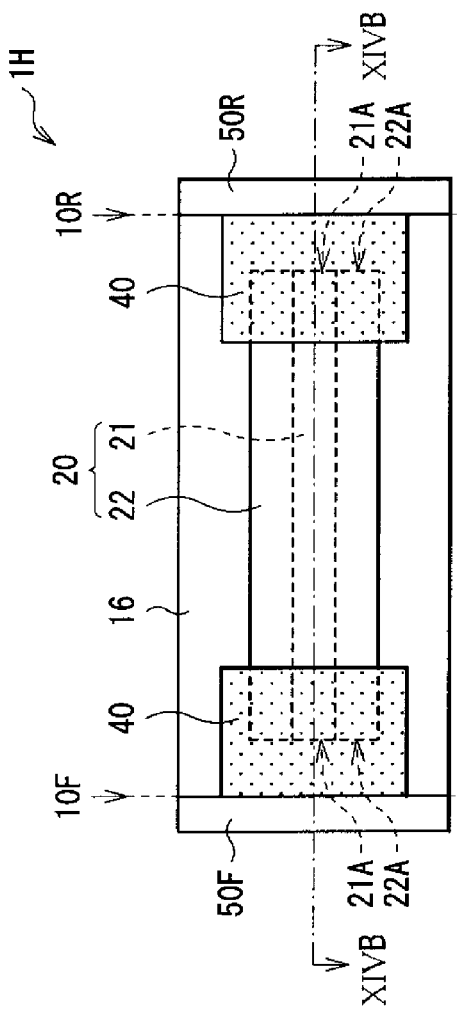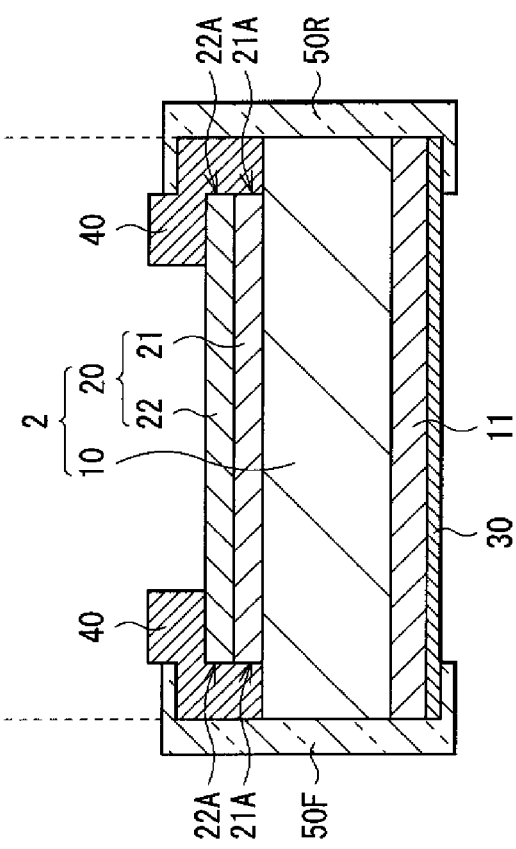
FIG. 14A
FIG. 14B

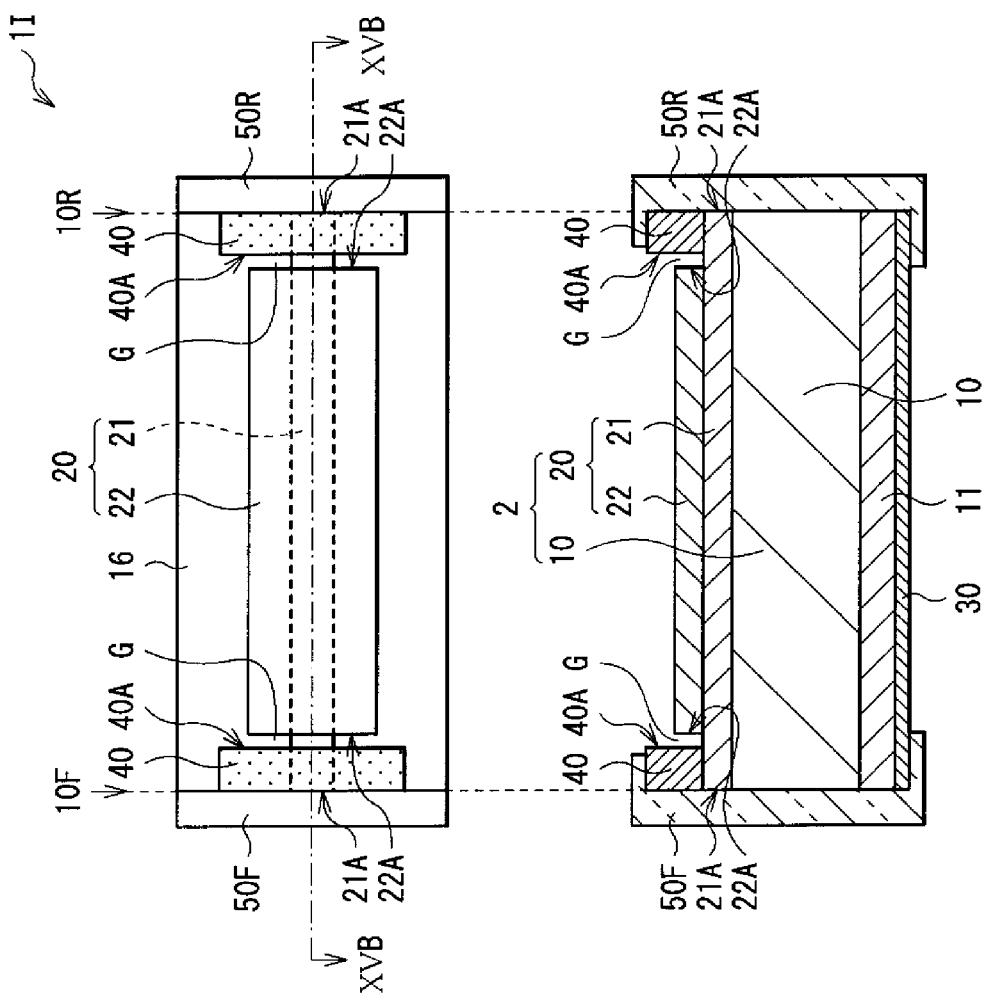

SEMICONDUCTOR LASER ELEMENT AND MANUFACTURING METHOD OF THE SAME

BACKGROUND

The present disclosure relates particularly to a semiconductor laser element suitable for use as an edge-emitting semiconductor laser and to a manufacturing method of the same.

The higher the semiconductor laser output becomes, the greater the amount of heat generated at the edges of the resonator, likely resulting in a short service life due to damage to the edges. Damage to the edges takes place in the following mechanism.

That is, when a current is injected, a nonradiative recombination current flows via a surface level existing on the edge. The carrier density is higher near the edges than inside the laser, thus resulting in large photoabsorption. This photoabsorption generates heat, reducing the bandgap energy near the main emission edge and leading to even greater photoabsorption. Such a positive feedback process gives rise to an excessive increase in temperature of the main emission edge having high optical power density.

As a structure adapted to suppress the heating of the edges causing by the above positive feedback, for example, Japanese Patent Laid-Open No. Hei 10-75008 (hereinafter referred to as Patent Document 1) describes the formation of a p-side electrode over the entire surface of the edges to ensure proper heat diffusion from the edges. However, the structure in related art described in Patent Document 1 causes the p-side electrode to be pulled during cleavage, resulting in peeling of the p-side electrode or hanging of the p-side electrode on the edge.

As a structure adapted to prevent peeling and hanging of the p-side electrode, on the other hand, Japanese Patent Laid-Open No. 2002-084036 attempts to solve the problem by moving the p-side electrode back from the edge.

SUMMARY

However, moving the p-side electrode back from the edge makes it difficult to achieve high output beyond a given level due to the above aggravated efficiency in heat diffusion.

It is desirable to provide a semiconductor laser element capable of accelerating heat diffusion from the resonator edges and a manufacturing method of the same.

A semiconductor laser element according to the present disclosure includes the following constituent components (A) to (C):
(A) On a substrate, a laser structure section configured to include a semiconductor laminated structure having an n-type semiconductor layer, active layer and p-type semiconductor layer in this order, and a p-side electrode on top of the p-type semiconductor layer
(B) A pair of resonator edges provided on two opposed lateral sides of the semiconductor laminated structure
(C) Films made of a non-metallic material having a thermal conductivity higher than that of surrounding gas, and provided in the region of the top side of the laser structure section including the positions of the resonator edges Here, the term "surrounding gas" refers to an atmosphere when a semiconductor laser element is used, and more specifically, air or nitrogen (if the gas is sealed in a package or the like). Further, the term "non-metallic material" refers to any of semiconductors and insulators. Insulators also include, for example, resins.

In the semiconductor laser element according to the present disclosure, films made of a non-metallic material having a thermal conductivity higher than that of the surrounding gas are formed in the region of the top side of the laser structure section including the positions of the resonator edges. As a result, heat generated from the resonator edges is diffused via these films.

A manufacturing method of a semiconductor laser element according to the present disclosure includes the following (A) to (C):
(A) Forming, on a substrate, a laser structure section configured to include a semiconductor laminated structure having an n-type semiconductor layer, active layer and p-type semiconductor layer in this order, and a p-side electrode on top of the p-type semiconductor layer
(B) Forming a film made of a non-metallic material having a thermal conductivity higher than that of surrounding gas in the region of the top side of the laser structure section including positions where resonator edges are to be formed
(C) Forming the pair of resonator edges by cleaving two opposed lateral sides of the semiconductor laminated structure after the formation of the film In the semiconductor laser element or manufacturing method of the same according to the present disclosure, a film made of a non-metallic material having a thermal conductivity higher than that of the surrounding gas is provided in the region of the top side of the laser structure section including the positions of the resonator edges, thus making it possible to accelerate heat diffusion from the resonator edges.

BRIEF DESCRIPTION OF THE DRAWINGS

FIG. 2A is a top view illustrating the configuration of the semiconductor laser element shown in FIG. 1 as seen from the side of a p-side electrode, and FIG. 2B is a cross-sectional view along line IIB-IIB in FIG. 2A;

FIGS. 3A to 3D are cross-sectional views illustrating a manufacturing method of the semiconductor laser element shown in FIG. 1 in the order of steps;

FIG. 9A is a top view illustrating the configuration of a semiconductor laser element according to modification example 3 as seen from the side of the p-side electrode, and FIG. 9B is a cross-sectional view along line IXB-IXB in FIG. 9A;

FIG. 11A is a top view illustrating the configuration of a semiconductor laser element according to modification example 5 as seen from the side of the p-side electrode, and FIG. 11B is a cross-sectional view along line XIB-XIB in FIG. 11A;

FIG. 14A is a top view illustrating the configuration of a semiconductor laser element according to modification example 8 as seen from the side of the p-side electrode, and FIG. 14B is a cross-sectional view along line XIVB-XIVB in FIG. 14A;

FIG. 15A is a top view illustrating the configuration of a semiconductor laser element according to modification example 9 as seen from the side of the p-side electrode, and FIG. 15B is a cross-sectional view along line XVB-XVB in FIG. 15A.

DETAILED DESCRIPTION OF THE PREFERRED EMBODIMENT

A detailed description will be given below of the preferred embodiment of the present disclosure with reference to the accompanying drawings. It should be noted that the description will be given in the following order.

1. Embodiment (example in which a non-metallic film is provided near both resonator edges on the top side of a p-side electrode)
2. Modification example 1 (example in which the non-metallic film extends from one resonator edge to the other)
3. Modification example 2 (example in which the non-metallic film is provided near one of the resonator edges)
4. Modification example 3 (example in which the non-metallic film has an in-plane shape free from acute angles)
5. Modification example 4 (example in which the non-metallic film has a shape divided in an in-plane direction)
6. Modification example 5 (example in which the thickness of the non-metallic film changes in an in-plane direction)
7. Modification example 6 (example in which the non-metallic film is affixed with an adhesive)
8. Modification example 7 (example in which both edges of a p-side contact layer and p-side pad layer are located at the same positions as the resonator edges)
9. Modification example 8 (example in which both edges of the p-side contact layer and p-side pad layer are located backward from the resonator edges)
10. Modification example 9 (example in which the edges of the p-side contact layer are located at the same positions as the resonator edges, the edges of the p-side pad layer are located backward from the resonator edges, and the edges of the p-side pad layer are spaced from those of the non-metallic film)
11. Modification example 10 (example in which both edges of the p-side contact layer and p-side pad layer are located backward from the resonator edges, and the edges of the p-side pad layer are spaced from those of the non-metallic film)

Figure 1:
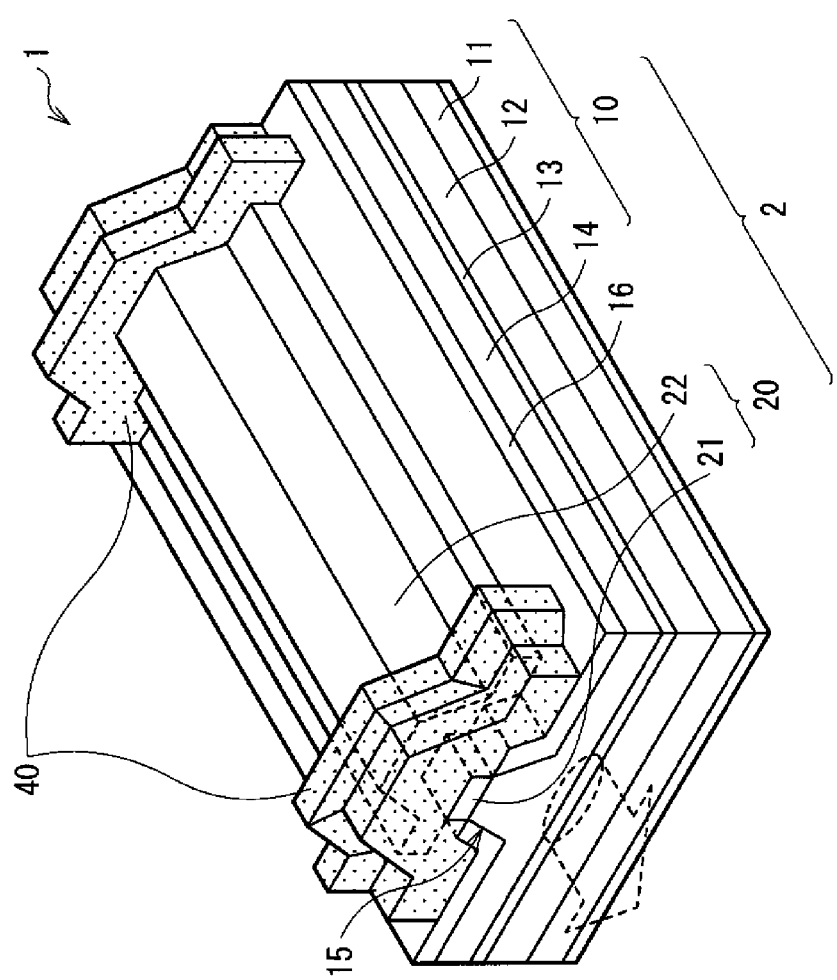
FIG. 1 is a perspective view illustrating the configuration of a semiconductor laser element according to an embodiment of the present disclosure.

FIG. 1 illustrates the overall configuration of a semiconductor laser element 1 according to an embodiment of the present disclosure. FIG. 2A illustrates, in plan view, the configuration of the semiconductor laser element 1 as seen from the side of a p-side electrode. FIG. 2B illustrates a cross-sectional view along line IIB-IIB in FIG. 2A. The semiconductor laser element 1 is, for example, a blue/blue-violet semiconductor laser element with an oscillation wavelength of about 500 nm or less such as 400 nm or so, which is used for recording to or reproduction from a BD (Blu-ray Disc), for example, in a personal computer or home gaming machine. The semiconductor laser element 1 has a laser structure section 2 on one side (top side) of a substrate 11 made, for example, of GaN. The laser structure section 2 includes a semiconductor laminated structure 10 and p-side electrode 20 provided on top of the semiconductor laminated structure 10. An n-side electrode 30 is provided on the other side (bottom side) of the substrate 11.

The semiconductor laminated structure 10 includes an n-type semiconductor layer 12, active layer 13 and p-type semiconductor layer 14 that are stacked in this order on the substrate 11. A protruding portion 15 in the form of a band is provided in the p-type semiconductor layer 14 for current confinement. The region of the active layer 13 associated with the protruding portion 15 serves as a light-emitting region. Insulating layers 16 are provided, one on each side of the protruding portion 15. A pair of opposed lateral sides along the length of the protruding portion 15 (hereinafter referred to as the resonator direction) in the semiconductor laminated structure 10 serve as resonator edges 10F and 10R.

The p-side electrode 20 is provided on top of the p-type semiconductor layer 14. The p-side electrode 20 has, for example, a p-side contact electrode 21 and p-side pad electrode 22 in this order from the side of the p-type semiconductor layer 14. The p-side contact electrode 21 is electrically connected to the top side of the protruding portion 15 of the p-type semiconductor layer 14. The p-side pad electrode 22 is used for wire bonding connection and provided over a larger area than the p-side contact electrode 21.

The p-side contact electrode 21 extends, for example, from the resonator edge 10F, i.e., one of the resonator edges, to the resonator edge 10R, i.e., the other resonator edge. That is, each of edges 21A of the p-side contact electrode 21 is located at the same position as the resonator edge 10F or 10R. On the other hand, each of edges 22A of the p-side pad electrode 22 is provided inward from the resonator edge 10F or 10R. As described above, it is possible to suppress the peeling of the p-side electrode 20 or hanging of the p-side electrode 20 on the resonator edge 10F or 10R during cleavage by moving each of the edges 22A of the p-side pad electrode 22 inward and reducing the thickness of the p-side electrode 20 near the resonator edges 10F and 10R.

Non-metallic films 40 are provided, each in the region of the top side of the laser structure section 2 including one of the positions of the resonator edges 10F and 10R. The non-metallic films 40 are made of a non-metallic material having a thermal conductivity higher than that of the surrounding gas. This allows for the semiconductor laser element 1 to accelerate heat diffusion from the resonator edges 10F and 10R.

Each of the non-metallic films 40 extends on top of the p-side electrode 20 from one of the positions of the resonator edges 10F and 10R in the resonator direction. The p-side electrode 20 includes the p-side contact electrode 21 and p-side pad electrode 22. The non-metallic films 40 are provided above the semiconductor laminated structure 10 and the p-side electrode 20, serving as the uppermost layer of the semiconductor laser element 1. An in-plane length L40 of each of the non-metallic films 40 in the resonator direction from the resonator edge 10F or 10R is not specifically limited. However, the in-plane length L40 should preferably be, for example, 1 µm or more in consideration of possible deviation of the cleavage plane in the manufacturing steps which will be described later.

The non-metallic material of which the non-metallic films 40 are made should preferably be more brittle than the material of the p-side electrode 20. This makes it possible to suppress the peeling of the non-metallic films 40 or hanging of the non-metallic films 40 on the resonator edges 10F and 10R during cleavage.

Further, the non-metallic material of which the non-metallic films 40 are made should preferably be higher in electrical resistance than the material of the p-side electrode 20. This makes it possible to provide a heat diffusion path using the non-metallic films 40 independently of a current flow path while at the same time regulating the current flow path with the p-side electrode 20, thus providing a higher degree of design freedom.

More specifically, the non-metallic material of which the non-metallic films 40 are made should preferably be at least one selected, for example, from a group of aluminum nitride (AlN), silicon carbide (SiC), diamond and diamond-like carbon. The reason for this is that these materials offer the above-mentioned properties, namely, brittleness, high thermal conductivity and high electrical resistance. Although not specifically limited, the thickness of the non-metallic films 40 should preferably be several tens of nm or more.

It should be noted that a pair of reflecting mirror films 50F and 50R (not shown in FIG. 1, and see FIGS. 2A and 2B) are provided, one for each of the pair of resonator edges 10F and 10R. The reflectances of the reflecting mirror films 50F and 50R are adjusted so that the reflecting mirror film 50F has a lower reflectance, and the reflecting mirror film 50R a higher reflectance. This allows for light generated via the active layer 13 to travel back and forth between the pair of reflecting mirror films 50F and 50R, thus amplifying the light and emitting it from the reflecting mirror film 50F as a laser beam. The reflecting mirror films 50F and 50R cover the edges of the semiconductor laminated structure 10, insulating layers 16, p-side electrode 20, n-side electrode 30 and non-metallic films 40. However, the reflecting mirror films 50F and 50R may rest on part of the top side of the non-metallic films 40 (not shown in FIG. 2A, and see FIG. 2B; the same holds true for FIGS. 6A to 16B).

A description will be given below of the thickness and material of each of the layers given above. The substrate 11 is made, for example, of n-type GaN added with silicon (Si) as an n-type impurity.

The n-type semiconductor layer 12 has, for example, an n-type clad layer and n-side guide layer in this order from the side of the substrate 11. The n-type clad layer is, for example, 2.5 µm to 2.6 µm in thickness in the stacking direction (hereinafter simply referred to as thickness) and made of n-type AlGaN mixed crystal added with silicon (Si) as an n-type impurity. The n-side guide layer is, for example, 0.21 µm in thickness and made of n-type GaN added with silicon (Si) as an n-type impurity.

The active layer 13 is, for example, 0.056 µm in thickness and has a multiple quantum well structure made up of well and barrier layers. Each of the well and barrier layers is formed with $In_x Ga_{1-x}N$ (where x≥0) mixed crystal having a different composition.

The p-type semiconductor layer 14 has, for example, a p-side guide layer, electron barrier layer, p-type clad layer and p-side contact layer in this order from the side of the substrate 11. The p-side guide layer is, for example, 0.19 µm in thickness and made of p-type GaN added with magnesium (Mg) as a p-type impurity. The electron barrier layer is, for example, 0.02 µm in thickness and made of p-type AlGaN mixed crystal added with magnesium (Mg) as a p-type impurity. The p-type clad layer is, for example, 0.38 µm in thickness and has a superlattice structure made up of an AlGaN mixed crystal layer and a p-type GaN layer added with magnesium (Mg) as a p-type impurity. The p-side contact layer is, for example, 0.10 µm in thickness and made of p-type GaN added with magnesium (Mg) as a p-type impurity.

The insulating layers 16 are designed to control the horizontal mode and made of a dielectric material having a high refractive index such as $ZrO_2$, $Nb_2O_5$, $TiO_2$, $Ta_2O_5$, SiN, AlN, $HfO_2$, $Al_2O_3$ or ZnO.

The p-side contact electrode 21 and p-side pad electrode 22 of the p-side electrode 20 are both made of a metal and electrically connected to the p-type semiconductor layer 14. The p-side contact electrode 21 has, for example, palladium (Pd), platinum (Pt) and gold (Au) stacked one after another from the side of the p-type semiconductor layer 14. The p-side pad electrode 22 is made, for example, of gold (Au).

The n-side electrode 30 has, for example, titanium (Ti), platinum (Pt) and gold (Au) stacked one after another and is electrically connected to the n-type semiconductor layer 12 via the substrate 11.

The pair of reflecting mirror films 50F and 50R have different film compositions depending on the reflectances. The reflecting mirror film 50F of the main emission edge (front edge) 10F includes, for example, a single layer of aluminum oxide (Al2O3). The reflecting mirror film 50R of the rear edge includes, for example, multiple films such as aluminum oxide (Al2O3) and titanium oxide (TiO2).

The semiconductor laser element 1 can be manufactured, for example, in the following manner.

First, the substrate 11 made, for example, of GaN is made available. The n-type semiconductor layer 12, active layer 13 and p-type semiconductor layer 14, each made of the above-mentioned material, are grown on the surface of the substrate 11, for example, by MOCVD (Metal Organic Chemical Vapor Deposition) method, thus forming the semiconductor laminated structure 10.

Next, an etching mask is formed on top of the p-type semiconductor layer 14, followed, for example, by dry etching, thus removing part of the p-type semiconductor layer 14 along its thickness and forming the protruding portion 15 in the form of a band. Next, the insulating layers 16 made of the above-mentioned material are formed, one on each lateral side of the protruding portion 15.

Then, as illustrated in FIG. 3A, the p-side contact electrode 21 and p-side pad electrode 22 are stacked on top of the insulating layers 16 and above the p-type semiconductor layer 14, thus forming the p-side electrode 20. At this time, the p-side contact electrode 21 is formed, for example, continuously beyond intended formation positions (cleavage positions) 10C of the resonator edges 10F and 10R and in common for the plurality of semiconductor laser elements 1 that are adjacent to each other in the resonator direction. On the other hand, the p-side pad electrode 22 is formed for each of the semiconductor laser elements 1 and inward from the intended formation positions (cleavage positions) 10C of the resonator edges 10F and 10R. This allows formation of the laser structure section 2 made up of the semiconductor laminated structure 10 and p-side electrode 20.

After the formation of the p-side electrode 20, the non-metallic films 40 made of the above-mentioned material are formed, for example, by vapor deposition or sputtering, in the region of the top side of the laser structure section 2 including the intended formation positions (cleavage positions) 10C of the resonator edges 10F and 10R as illustrated in FIG. 3B.

Further, the substrate 11 is reduced in thickness to about 100 μm, for example, by lapping or polishing the rear side thereof, and then the n-side electrode 30 is formed on the bottom side (rear side) of the substrate 11 as illustrated in FIG. 3B.

Figure 3C:
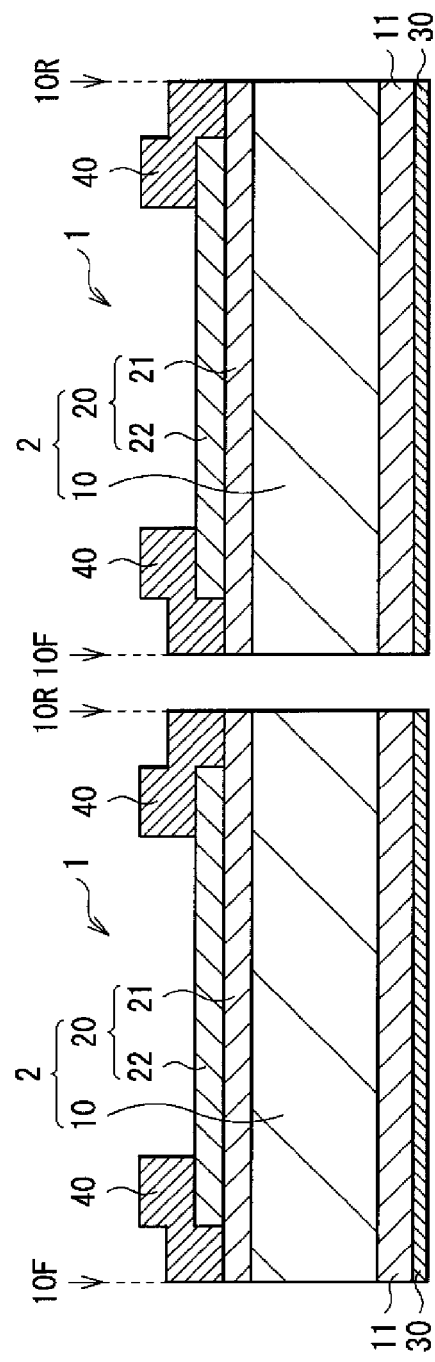

Following the above step, the semiconductor laser elements 1 are cleaved as illustrated in FIG. 3C, thus forming the pair of resonator edges 10F and 10R and separating the semiconductor laser elements 1 one from the other. If the semiconductor laser elements 1 are cleaved after the formation of the non-metallic films 40 as described above, it is possible to form the non-metallic films 40 of a constant thickness and volume immediately above the resonator edges 10F and 10R in a stable manner. In particular, if the semiconductor laser elements 1 are made of a gallium nitride-based compound semiconductor, the cleavage plane position is likely to deviate due to extremely poor cleavage. In this case, the in-plane length L40 of each of the non-metallic films 40 is set aside that is sufficiently larger than the expected deviation. This makes it possible to form the non-metallic films 40 immediately above the resonator edges 10F and 10R in a stable manner even in the event of a deviation of the cleavage plane position.

Figure 3D:
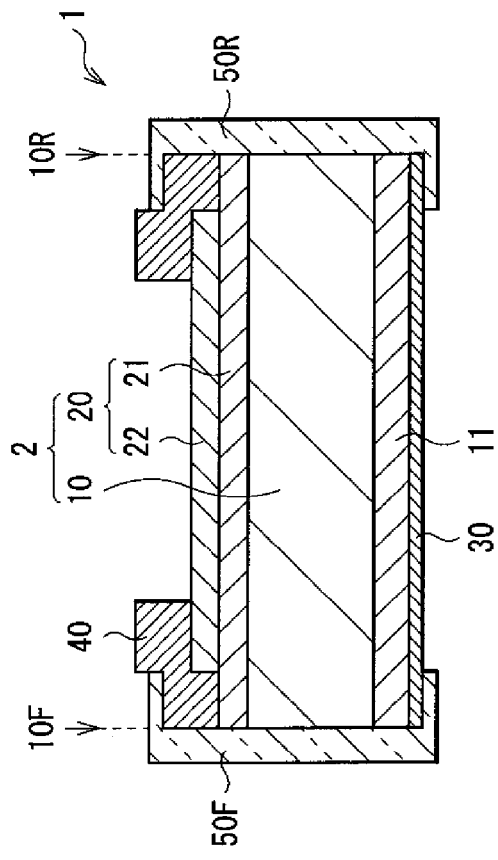

After the cleavage, the pair of resonator edges 10F and 10R may be coated as appropriate, thus forming the reflecting mirror films 50F and 50R as illustrated in FIG. 3D. Part of the reflecting mirror films 50F and 50R may go around onto the top sides of the non-metallic films 40. It should be noted that there are the following restrictions as to heat diffusion by the going-around of the reflecting mirror films 50F and 50R, and it is difficult to expect a significant effect therefrom. These restrictions are: (1) the edge coating thickness is determined according to the optical conditions, and therefore the thickness is limited; (2) only an optically transparent material can be used; and (3) the thickness is not stable because of the going-around. Therefore, it is effective to form the non-metallic films 40 separately from the reflecting mirror films 50F and 50R as in the present embodiment. This completes the manufacture of the semiconductor laser element 1 shown in FIG. 1.

In this semiconductor laser element 1, when a given voltage is applied between the n-side electrode 30 and p-side electrode 20, a current is injected into the active layer 13, allowing for light to be emitted as a result of recombination of electrons and holes. This light is reflected by the pair of reflecting mirror films 50F and 50R and travels back and forth therebetween, producing laser oscillation and being emitted externally as a laser beam. Here, the non-metallic films 40 made of a non-metallic material having a thermal conductivity higher than that of the surrounding gas are provided in the region of the top side of the laser structure section 2 including the positions of the resonator edges 10F and 10R. Heat generated from the resonator edges 10F and 10R diffuses to the non-metallic films 40 via the p-side electrode 20 (p-side contact electrode 21 in the present embodiment). This keeps the temperature rise of the resonator edges 10F and 10R to a minimum, thus minimizing the reduction in service life.

Figure 4:
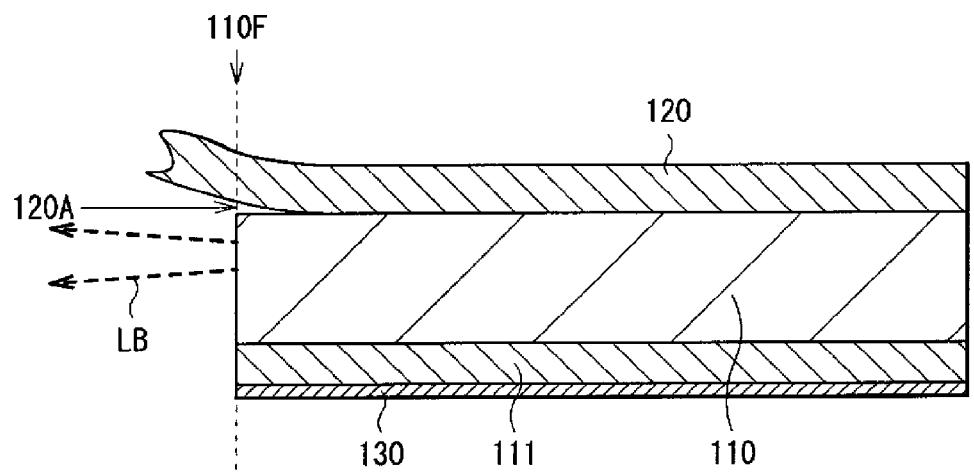
FIG. 4 is a diagram illustrating a problem with a semiconductor laser element in related art.
Figure 5:
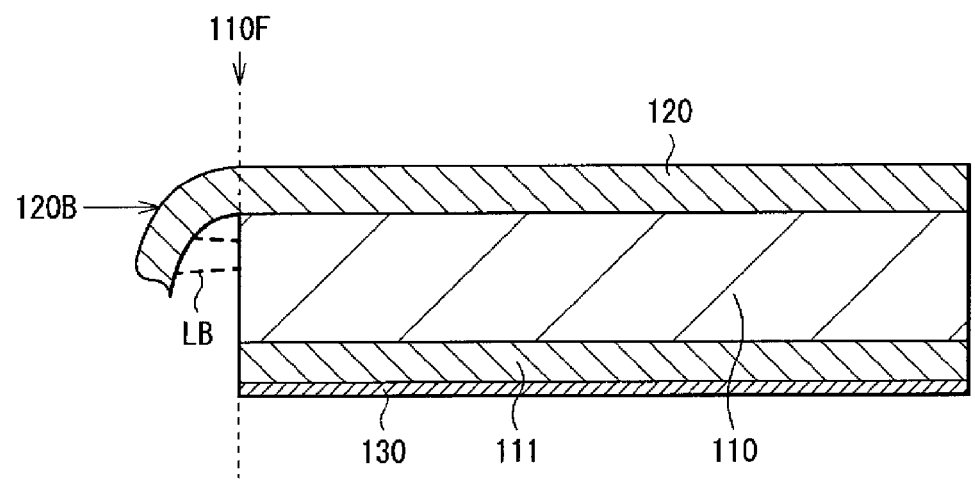
FIG. 5 is a diagram illustrating another problem with a semiconductor laser element in related art.

In contrast, the p-side electrode is formed across the cleavage plane in related art to suppress the heating of the edges. As a result, the p-side electrode is pulled during cleavage, thus causing a peel 120A of a p-side electrode 120 and resulting in poor heat radiation as illustrated in FIG. 4 or causing hanging 120B of the p-side electrode 120 on an edge 110F as illustrated in FIG. 5 and interfering with travel of a laser beam LB. Further, if the p-side electrode is moved back from the cleavage planes to prevent peeling or hanging of the p-side electrode, heat generated from the resonator edges is not diffused, thus making it difficult to keep the temperature rise of the edges to a minimum. It should be noted that in FIGS. 4 and 5, components corresponding to those in FIGS. 1 to 3B are denoted by reference numerals in the hundreds.

As described above, in the present embodiment, the non-metallic films 40 made of a non-metallic material having a thermal conductivity higher than that of the surrounding gas are provided in the region of the top side of the laser structure section 2 including the positions of the resonator edges 10F and 10R, thus accelerating heat diffusion from the resonator edges 10F and 10R, minimizing the reduction in service life and providing even higher output. The higher the thermal conductivity of the non-metallic material of which the non-metallic films 40 are made, the greater the advantageous effects.

Further, the non-metallic material of which the non-metallic films 40 are made is more brittle than the material of the p-side electrode 20. This makes it possible to suppress the peeling and hanging of the non-metallic films 40.

Still further, each of the edges 21A of the p-side contact electrode 21 is provided at the same position as the resonator edge 10F or 10R, and each of the edges 22A of the p-side pad electrode 22 is provided inward from the resonator edge 10F or 10R, thus reducing the thickness of the p-side electrode 20 near the resonator edges 10F and 10R. As a result, it is possible to accelerate heat diffusion through the non-metallic films 40 while at the same time suppressing the peeling and hanging of the p-side electrode 20, thus minimizing the reduction in service life even more effectively.

In addition, the non-metallic material of which the non-metallic films 40 are made is higher in electrical resistance than the material of the p-side electrode 20. This makes it possible to provide a heat diffusion path using the non-metallic films 40 independently of a current flow path while at the same time regulating the current flow path with the p-side electrode 20, thus providing a higher degree of design freedom.

A description will be given below of modification examples in relation to the non-metallic films 40.

MODIFICATION EXAMPLE 1

Figures 6A, 6B:
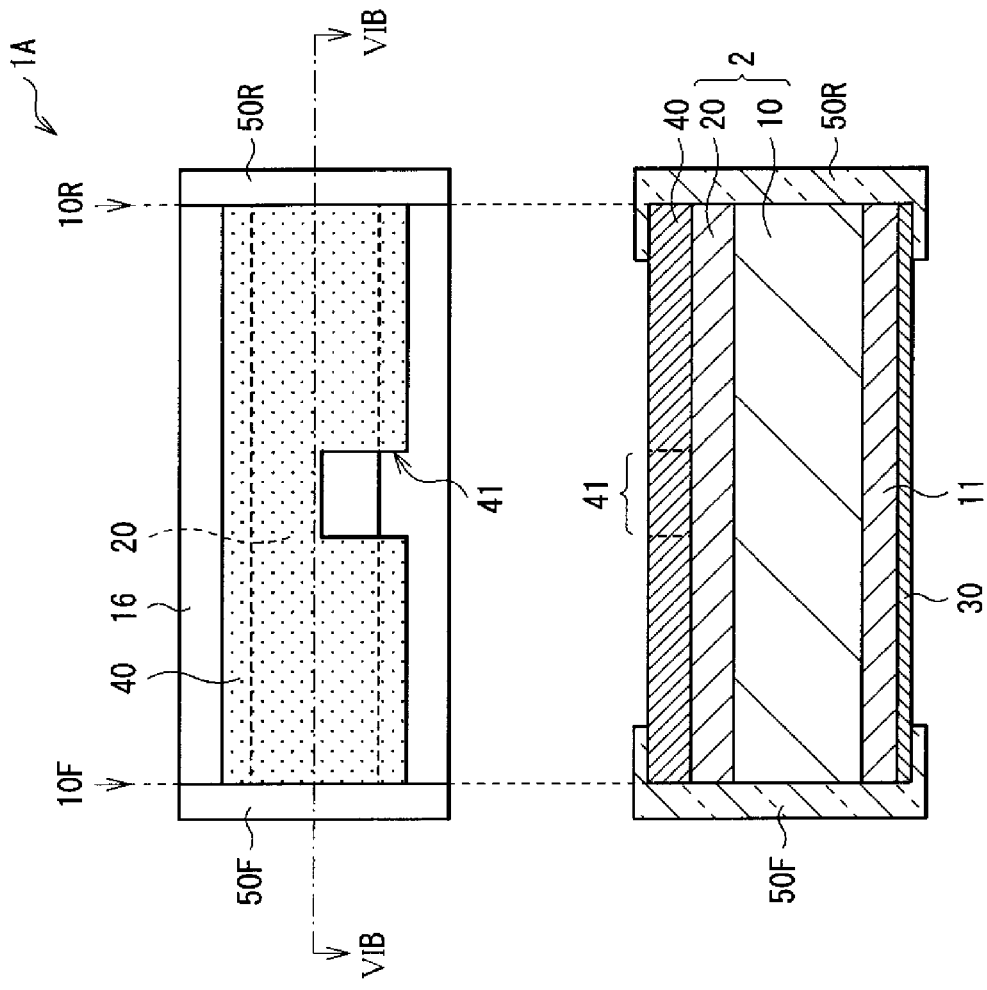
FIG. 6A is a top view illustrating the configuration of a semiconductor laser element according to modification example 1 as seen from the side of the p-side electrode.
FIG. 6B is a cross-sectional view along line VIB-VIB in FIG. 6A.
Figures 7A, 7B:
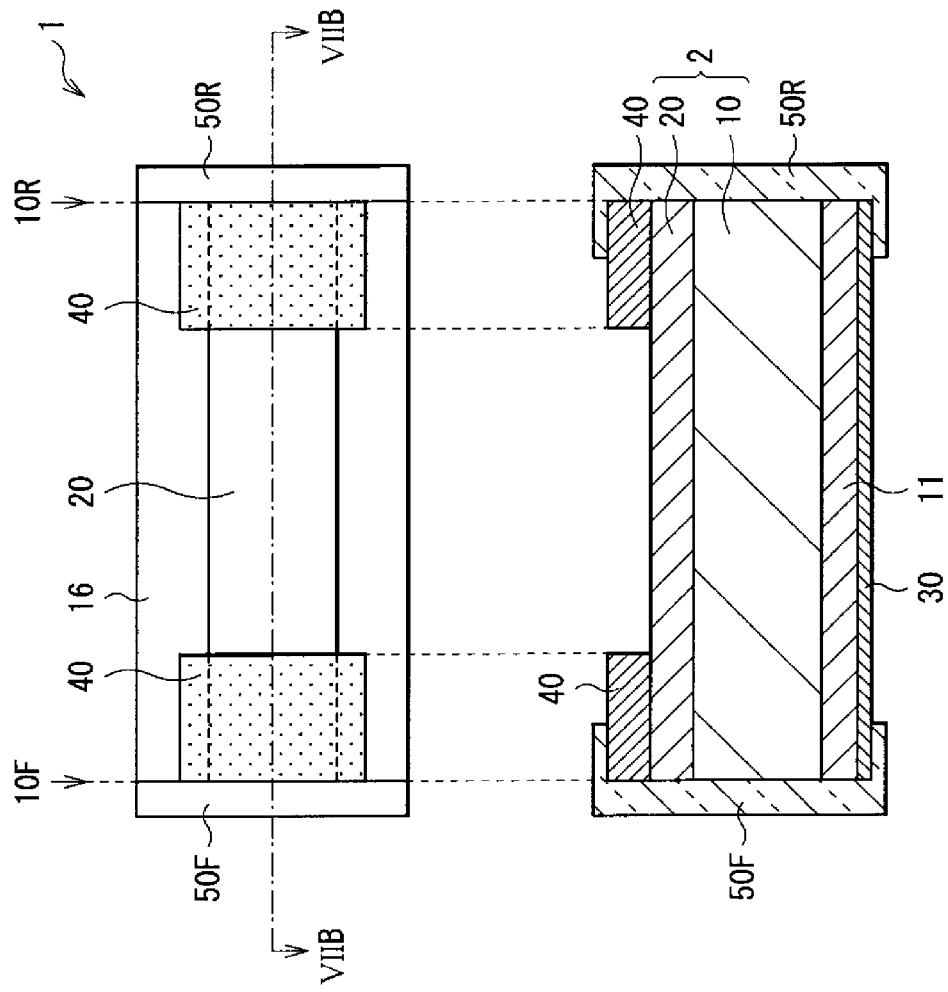
FIG. 7A is a top view illustrating the schematic configuration of the semiconductor laser element shown in FIG. 1 as seen from the side of the p-side electrode.
FIG. 7B is a cross-sectional view along line VIIB-VIIB in FIG. 7A.

FIGS. 6A and 6B illustrate the configurations, in top and cross-sectional views, of a semiconductor laser element 1A according to modification example 1. In the above embodiment, a description was given of a case in which the non-metallic films 40 are provided only near the resonator edges 10F and 10R adapted to generate a large amount of heat as schematically shown in FIGS. 7A and 7B. In contrast, in the present modification example, the non-metallic film 40 spreads across the entire region in the resonator direction spanning from the resonator edge 10F, i.e., one of the resonator edges, to the resonator edge 10R, i.e., the other resonator edge, except for a wire-bonding opening 41 as illustrated in FIGS. 6A and 6B. This ensures highly efficient heat diffusion through the large-area non-metallic film 40. Except in this respect, the semiconductor laser element 1A is identical in configuration, operation and effect to and can be manufactured in the same manner as the counterpart according to the above embodiment.

MODIFICATION EXAMPLE 2

Figure 8A:
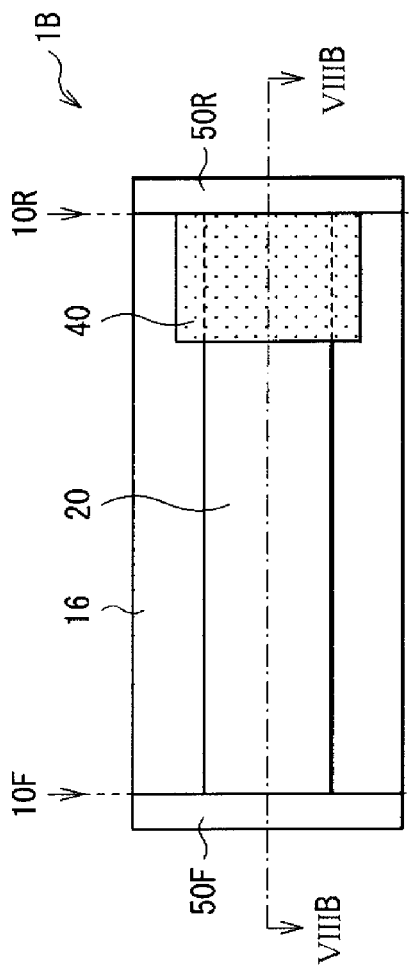
FIG. 8A is a top view illustrating the configuration of a semiconductor laser element according to modification example 2 as seen from the side of the p-side electrode.
Figure 8B:
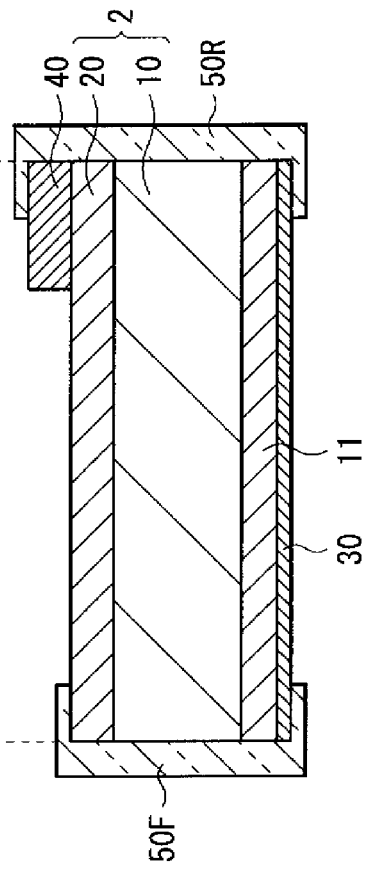
FIG. 8B is a cross-sectional view along line VIIIB-VIIIB in FIG. 8A.

FIGS. 8A and 8B illustrate the configurations, in top and cross-sectional views, of a semiconductor laser element 1B according to modification example 2. In the present modification example, the non-metallic film 40 is provided near one of the resonator edges, i.e., the resonator edge 10F or 10R. In a semiconductor laser, the reflecting mirror films 50F and 50R may be formed so that the resonator edges 10F and 10R have different reflectances in order to increase efficiency of heat generation from one of the edges. At this time, the non-metallic film 40 is provided near the resonator edge 10F or 10R adapted to generate a larger amount of heat, thus accelerating heat diffusion from the resonator edge 10F or 10R and keeping the temperature rise thereof to a minimum. Except in this respect, the semiconductor laser element 1B is identical in configuration, operation and effect to and can be manufactured in the same manner as the counterpart according to the above embodiment.

MODIFICATION EXAMPLE 3

FIGS. 9A and 9B illustrate the configurations, in top and cross-sectional views, of a semiconductor laser element 1C according to modification example 3. In the semiconductor laser element 1C, the non-metallic films 40 have an in-plane shape with no acute angles. The shape of the non-metallic films 40 is not limited to an ellipse or circle as illustrated in FIGS. 9A and 9B. Instead, the shape of the non-metallic films 40 may be rectangle or triangle with rounded corners. If the non-metallic films 40 are made of a material having large stress, the non-metallic films 40 itself or the underlying material may crack. In particular, stress tends to concentrate on acute angle regions, making it likely that these regions may crack. If the non-metallic films 40 have a planar shape with no acute angles, it is possible to relax the stress within the non-metallic films 40, thus suppressing cracks even when the non-metallic material has large stress. This provides better selectability of materials. Except in this respect, the semiconductor laser element 1C is identical in configuration, operation and effect to and can be manufactured in the same manner as the counterpart according to the above embodiment.

MODIFICATION EXAMPLE 4

Figure 10A:
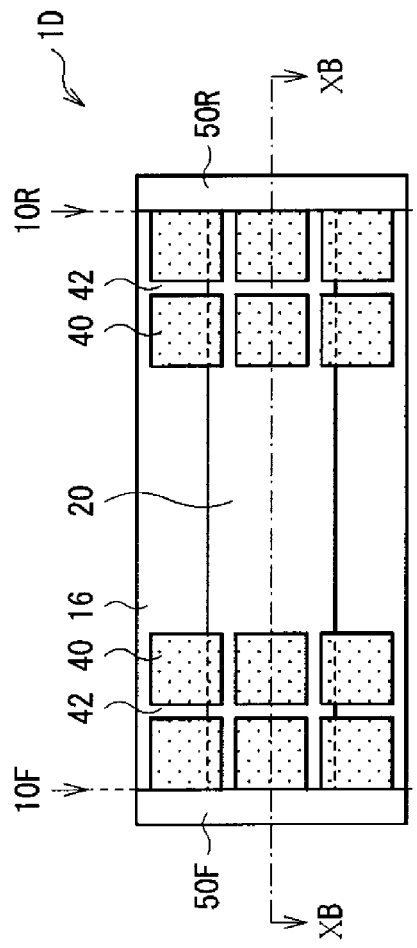
FIG. 10A is a top view illustrating the configuration of a semiconductor laser element according to modification example 4 as seen from the side of the p-side electrode.
Figure 10B:
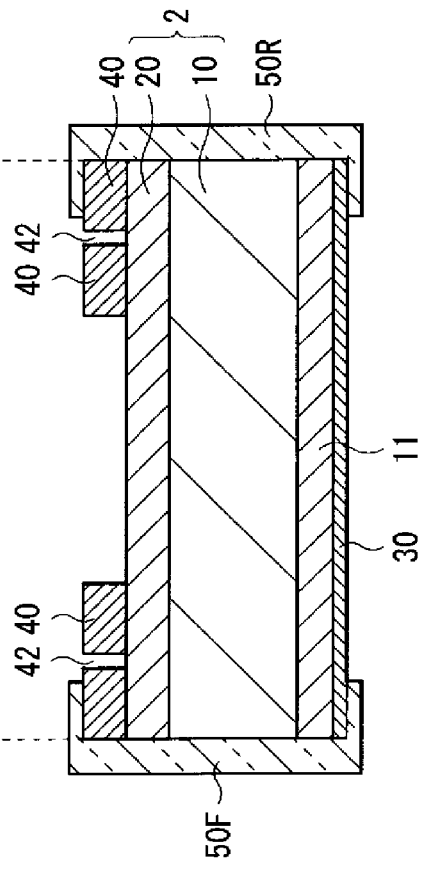
FIG. 10B is a cross-sectional view along line XB-XB in FIG. 10A.

FIGS. 10A and 10B illustrate the configurations, in top and cross-sectional views, of a semiconductor laser element 1D according to modification example 4. In the present modification example, the non-metallic films 40 are divided in an in-plane direction by a slit 42 in a lattice form. Stress in the films is released at the divided portion (slit 42), thus suppressing cracks in the same manner as in modification example 3 and providing better selectability of materials. Except in this respect, the semiconductor laser element 1D is identical in configuration, operation and effect to and can be manufactured in the same manner as the counterpart according to the above embodiment.

MODIFICATION EXAMPLE 5

FIGS. 11A and 11B illustrate the configurations, in top and cross-sectional views, of a semiconductor laser element 1E according to modification example 5. In the present modification example, the thickness of the non-metallic films 40 changes in an in-plane direction. If a film with large stress is used, the larger the volume, the more likely cracks may occur. If the non-metallic films 40 have thick film portions 43 only near the resonator edges 10F and 10R adapted to generate a large amount of heat as illustrated in FIGS. 11A and 11B, it is possible to suppress cracks while at the same time ensuring improved efficiency in heat diffusion. Except in this respect, the semiconductor laser element 1E is identical in configuration, operation and effect to and can be manufactured in the same manner as the counterpart according to the above embodiment.

MODIFICATION EXAMPLE 6

Figure 12A:
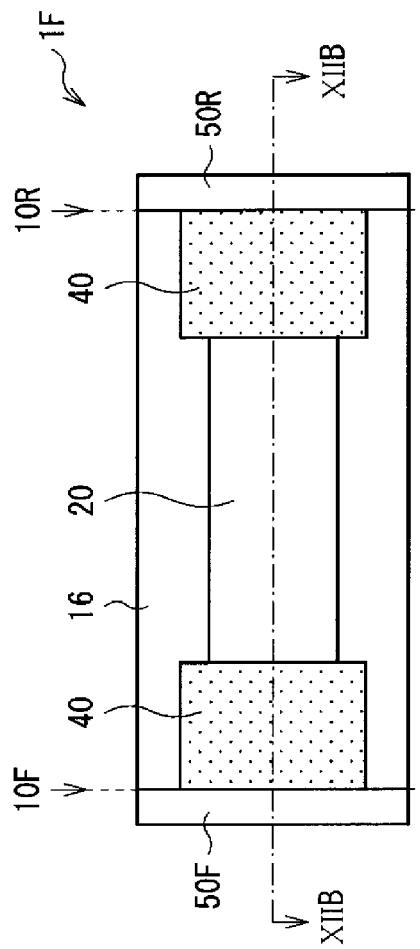
FIG. 12A is a top view illustrating the configuration of a semiconductor laser element according to modification example 6 as seen from the side of the p-side electrode.
Figure 12B:
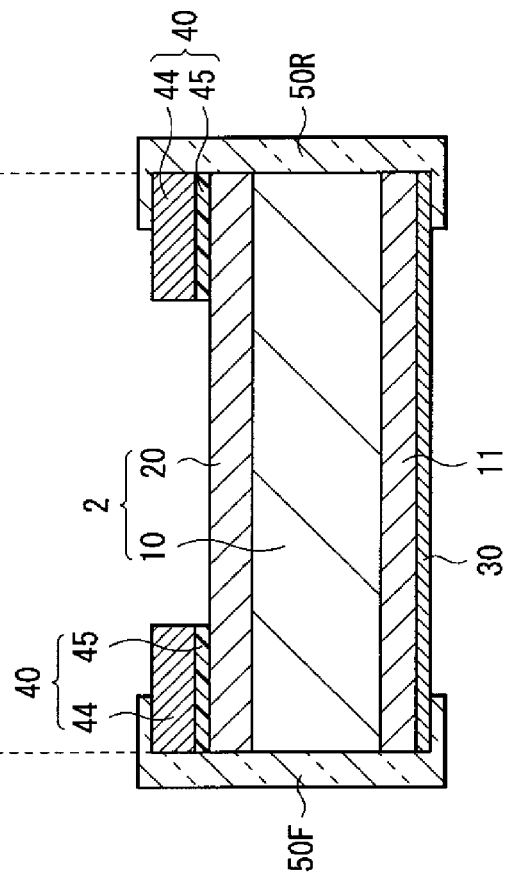
FIG. 12B is a cross-sectional view along line XIIB-XIIB in FIG. 12A.

FIGS. 12A and 12B illustrate the configurations, in top and cross-sectional views, of a semiconductor laser element 1F according to modification example 6. The semiconductor laser element 1F has the non-metallic films 40 in a sticker form that includes a film main body 44 and adhesive 45 for attachment provided on one side of the film main body 44. The non-metallic films 40 may be formed in a manner other than by vapor deposition or sputtering as described above. On the other hand, the non-metallic films 40 need not be a solid and may be in a liquid or gel form. For example, it is possible to form the non-metallic films 40 by applying a resin in a liquid or gel form and allowing it to dry to remove the solvent. Except in this respect, the semiconductor laser element 1F is identical in configuration, operation and effect to and can be manufactured in the same manner as the counterpart according to the above embodiment.

A description will be given next of modification examples 7 to 10 in relation to the p-side electrode 20.

MODIFICATION EXAMPLE 7

Figure 13A:
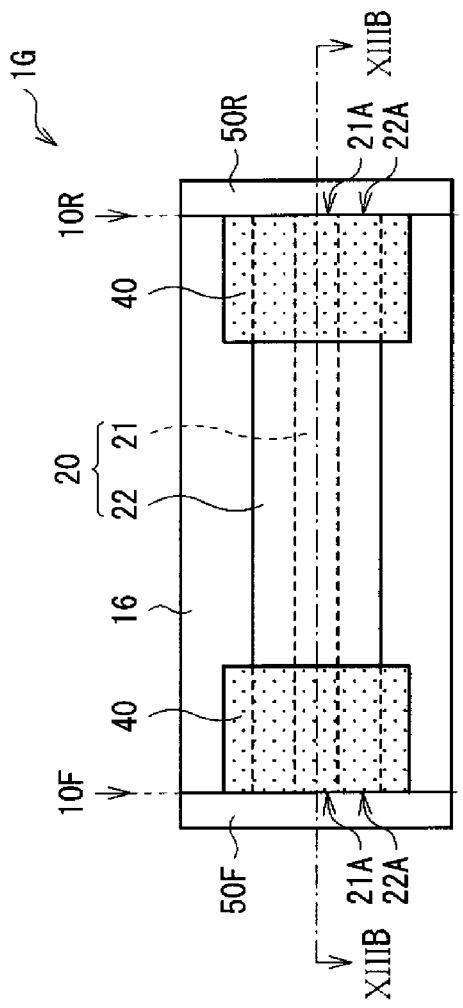
FIG. 13A is a top view illustrating the configuration of a semiconductor laser element according to modification example 7 as seen from the side of the p-side electrode.
Figure 13B:
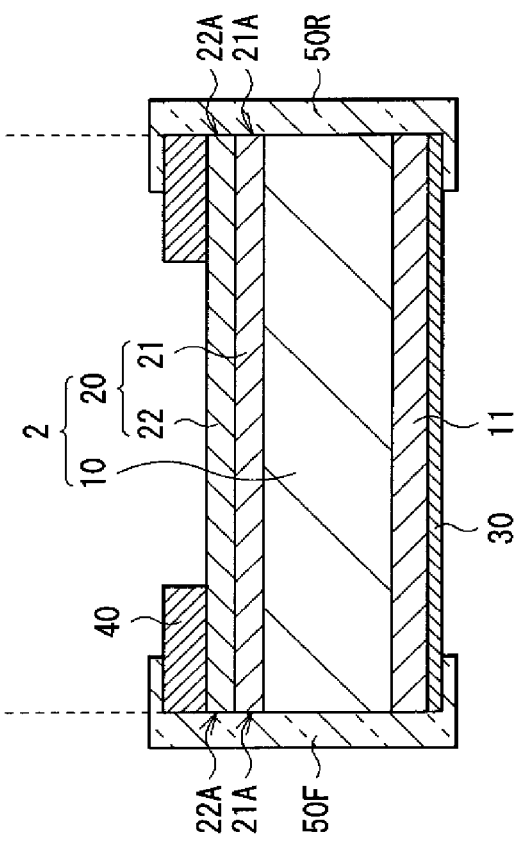
FIG. 13B is a cross-sectional view along line XIIIB-XIIIB in FIG. 13A.

FIGS. 13A and 13B illustrate the configurations, in top and cross-sectional views, of a semiconductor laser element 1G according to modification example 7. In the above embodiment, a description was given of a case in which each of the edges 21A of the p-side contact electrode 21 is provided at the same position as the resonator edge 10F or 10R, and each of the edges 22A of the p-side pad electrode 22 is provided away (inwardly back) from the resonator edge 10F or 10R as shown in FIGS. 2A and 2B. In contrast, in the present modification example, both the p-side contact electrode 21 and p-side pad electrode 22 extend from the resonator edge 10F, i.e., one of the resonator edges, to the resonator edge 10R, i.e., the other resonator edge. Both the edges 21A and 22A of the p-side contact electrode 21 and p-side pad electrode 22 are provided at the same positions as the resonator edges 10F and 10R. Here, the p-side contact electrode 21 and p-side pad electrode 22 are used to diffuse heat from the resonator edges 10F and 10R. Further, the overlaying non-metallic films 40 contribute to improved efficiency in heat diffusion, thus providing higher output. Except in this respect, the semiconductor laser element 1G is identical in configuration, operation and effect to and can be manufactured in the same manner as the counterpart according to the above embodiment.

MODIFICATION EXAMPLE 8

FIGS. 14A and 14B illustrate the configurations, in top and cross-sectional views, of a semiconductor laser element 1H according to modification example 8. In the present modification example, both the edges 21A and 22A of the p-side contact electrode 21 and p-side pad electrode 22 are provided away (inwardly back) from the resonator edge 10F or 10R. Part of each of the non-metallic films 40 is provided in the region of the top side of the semiconductor laminated structure 10 between the edges 21A and 22A of the p-side contact electrode 21 and p-side pad electrode 22 and the resonator edge 10F or 10R. The rest of each of the non-metallic films 40 is provided on the top side of the p-side electrode 20 made up of the p-side contact electrode 21 and p-side pad electrode 22. The present modification example makes it possible to directly accelerate heat diffusion from the resonator edges 10F and 10R by using the non-metallic films 40 and not via the p-side electrode 20, and positively suppress the peeling and hanging of the p-side electrode 20. Except in this respect, the semiconductor laser element 1H is identical in configuration, operation and effect to and can be manufactured in the same manner as the counterpart according to the above embodiment.

It should be noted that, in modification example 8, the edge 21A of the p-side contact electrode 21 and the edge 22A of the p-side pad electrode 22 need not necessarily be aligned with each other and may be displaced from each other in the resonator direction.

MODIFICATION EXAMPLE 9

FIGS. 15A and 15B illustrate the configurations, in top and cross-sectional views, of a semiconductor laser element 1I according to modification example 9. In the present modification example, the edges 21A of the p-side contact electrode 21 are located at the same positions as the resonator edges 10F and 10R. However, the edges 22A of the p-side pad electrode 22 are provided away (inwardly back) from the resonator edges 10F and 10R. Each of the edges 22A of the p-side pad electrode 22 is spaced from one of edges 40A of the non-metallic films 40 with a gap G therebetween. This suppresses possible deterioration of the p-side pad electrode 22 and non-metallic films 40 if contact between the two may lead to deterioration. Except in this respect, the semiconductor laser element 1I is identical in configuration, operation and effect to and can be manufactured in the same manner as the counterpart according to the above embodiment.

MODIFICATION EXAMPLE 10

Figure 16A:
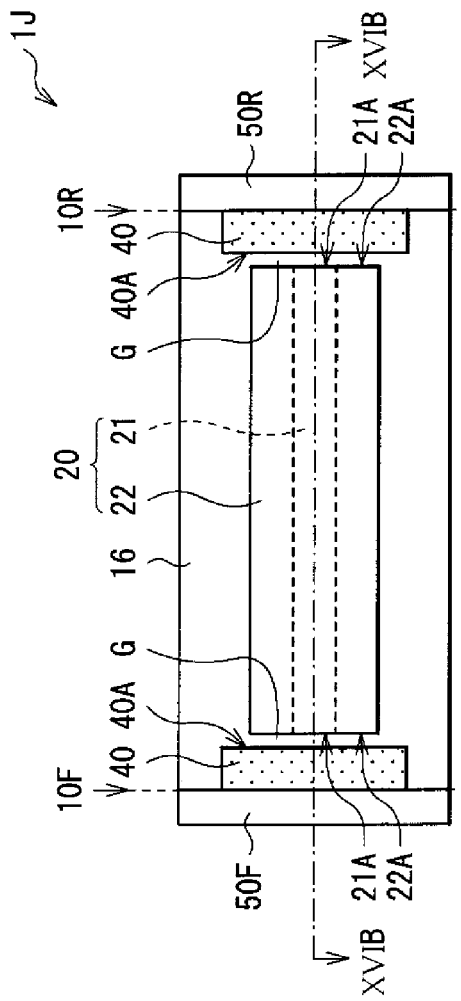
FIG. 16A is a top view illustrating the configuration of a semiconductor laser element according to modification example 10 as seen from the side of the p-side electrode.
Figure 16B:
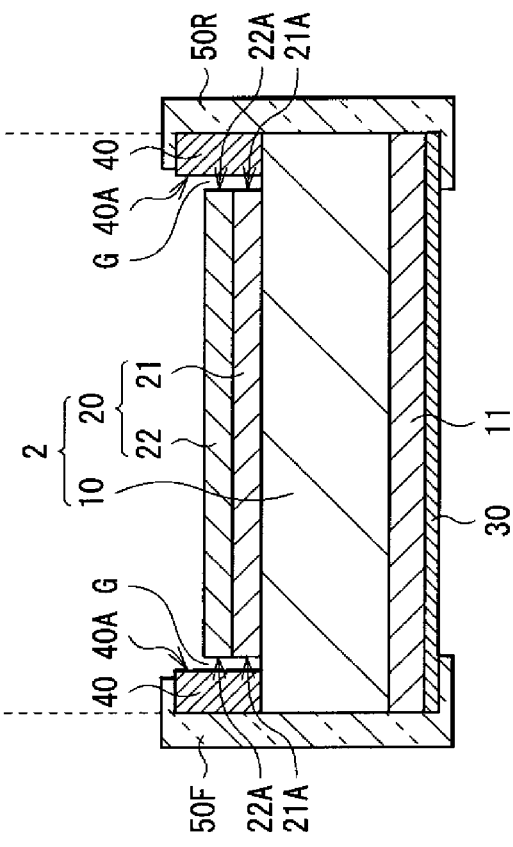
FIG. 16B is a cross-sectional view along line XVIB-XVIB in FIG. 16A.

FIGS. 16A and 16B illustrate the configurations, in top and cross-sectional views, of a semiconductor laser element 1J according to modification example 10. In the present modification example, both the edges 21A and 22A of the p-side contact electrode 21 and p-side pad electrode 22 are provided away (inwardly back) from the resonator edge 10F or 10R. The edges 21A and 22A of the p-side contact electrode 21 and p-side pad electrode 22 are spaced from one of edges 40A of the non-metallic films 40 with the gap G therebetween. This suppresses possible deterioration of the p-side contact electrode 21, p-side pad electrode 22 and non-metallic films 40 if contact between them may lead to deterioration. Except in this respect, the semiconductor laser element 1J is identical in configuration, operation and effect to and can be manufactured in the same manner as the counterpart according to the above embodiment.

It should be noted that modification examples 1 to 6 in relation to the non-metallic films 40 and modification examples 7 to 10 in relation to the p-side electrode 20 described above may be combined at will to provide a plurality of advantageous effects at the same time.

Although described by way of the preferred embodiment, the present disclosure is not limited thereto but may be modified in various ways. For example, the material, thickness, formation method and conditions for formation of each of the layers described in the above embodiment are not limited. Each of the layers may be made of other material, have other thickness, and formed by other method and under other conditions. In the above embodiment, for example, a description was given of a case in which the n-type semiconductor layer 12, active layer 13 and p-type semiconductor layer 14 are formed by MOCVD method. However, these layers may be formed by other organic metal gas phase growth method such as MOVPE method. Alternatively, MBE (Molecular Beam Epitaxy) method, for example, may be used.

In addition, a description was given by taking a specific configuration of the semiconductor laser element 1 as an example. However, all the layers need not be provided. Alternatively, other layers may be further provided.

Further, the present disclosure is not limited to a blue/blue-violet semiconductor laser that includes a nitride-based group III-V compound semiconductor containing at least gallium (Ga) from the group III elements and at least nitrogen (N) from the group V elements as described in the embodiment. Instead, the present disclosure is applicable to other lasers with higher outputs, having other oscillation frequencies or made of other materials.

It should be noted that the following configurations may also be used in the present technology.

(1) A semiconductor laser element including:

on a substrate, a laser structure section configured to include a semiconductor laminated structure having an n-type semiconductor layer, active layer and p-type semiconductor layer in this order, and a p-side electrode on top of the p-type semiconductor layer;

a pair of resonator edges provided on two opposed lateral sides of the semiconductor laminated structure; and films made of a non-metallic material having a thermal conductivity higher than that of surrounding gas, and provided in the region of the top side of the laser structure section including the positions of the resonator edges.

(2) The semiconductor laser element of feature (1), in which the non-metallic material is more brittle than the material of the p-side electrode.

(3) The semiconductor laser element of feature (1) or (2), in which the non-metallic material is higher in electrical resistance than the material of the p-side electrode.

(4) The semiconductor laser element of any one of features (1) to (3), in which the non-metallic material is at least one selected from a group of AlN, SiC, diamond and diamond-like carbon.

(5) The semiconductor laser element of any one of features (1) to (4), in which the in-plane shape of each of the films is divided into smaller portions.

(6) The semiconductor laser element of any one of features (1) to (5), in which the in-plane thickness of each of the films changes.

(7) The semiconductor laser element of any one of features (1) to (6), in which the p-side electrode has edges located inward from the resonator edges, and at least part of each of the films is provided in the region of the top side of the semiconductor laminated structure between the edges of the p-side electrode and the resonator edges.

(8) The semiconductor laser element of any one of features (1) to (6), in which the p-side electrode extends from one of the pair of resonator edges to the other thereof, and the films are provided on the top side of the p-side electrode.

(9) The semiconductor laser element of feature (8), in which the p-side electrode is thinner near the resonator edges.

(10) The semiconductor laser element of any one of features (1) to (9), in which the semiconductor laminated structure is made of a gallium nitride-based compound semiconductor.

(11) A manufacturing method of a semiconductor laser element including:

forming, on a substrate, a laser structure section configured to include a semiconductor laminated structure having an n-type semiconductor layer, active layer and p-type semiconductor layer in this order, and a p-side electrode on top of the p-type semiconductor layer;

forming a film made of a non-metallic material having a thermal conductivity higher than that of surrounding gas in the region of the top side of the laser structure section including positions where resonator edges are to be formed; and forming the pair of resonator edges by cleaving two opposed lateral sides of the semiconductor laminated structure after the formation of the film.

The present disclosure contains subject matter related to that disclosed in Japanese Priority Patent Application JP 2011-164168 filed in the Japan Patent Office on Jul. 27, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser element comprising:
   on a substrate, a laser structure section configured to include a semiconductor laminated structure having an n-type semiconductor layer, an active layer and a p-type semiconductor layer in this order, and a p-side electrode on top of the p-type semiconductor layer;
   a pair of resonator edges provided on two opposed lateral sides of the semiconductor laminated structure; and
   films made of a non-metallic material having a thermal conductivity higher than that of surrounding gas, and provided in a region of the top side of the laser structure section including the positions of the resonator edges.

2. The semiconductor laser element of claim 1, wherein the non-metallic material is more brittle than a material of the p-side electrode.

3. The semiconductor laser element of claim 1, wherein the non-metallic material is higher in electrical resistance than a material of the p-side electrode.

4. The semiconductor laser element of claim 1, wherein the non-metallic material is at least one selected from a group of AlN, SiC, diamond and diamond-like carbon.

5. The semiconductor laser element of claim 1, wherein the in-plane shape of each of the films is divided into smaller portions.

6. The semiconductor laser element of claim 1, wherein the in-plane thickness of each of the films changes.

7. The semiconductor laser element of claim 1,
   wherein the p-side electrode has edges located inward from the resonator edges, and
   at least part of each of the films is provided in the region of the top side of the semiconductor laminated structure between the edges of the p-side electrode and the resonator edges.

8. The semiconductor laser element of claim 1,
   wherein the p-side electrode extends from one of the pair of resonator edges to the other thereof, and
   the films are provided on the top side of the p-side electrode.

9. The semiconductor laser element of claim 8, wherein the p-side electrode is thinner near the resonator edges.

10. The semiconductor laser element of claim 1, wherein the semiconductor laminated structure is made of a gallium nitride-based compound semiconductor.

11. A semiconductor laser element manufacturing method comprising:
   forming, on a substrate, a laser structure section configured to include a semiconductor laminated structure having an n-type semiconductor layer, an active layer and a p-type semiconductor layer in this order, and a p-side electrode on top of the p-type semiconductor layer;
   forming a film made of a non-metallic material having a thermal conductivity higher than that of surrounding gas in the region of the top side of the laser structure section including positions where resonator edges are to be formed; and
   forming the pair of resonator edges by cleaving two opposed lateral sides of the semiconductor laminated structure after the formation of the film.

* * * * *